United States Patent [19]

Ohkawa et al.

[11] Patent Number: 5,361,016
[45] Date of Patent: Nov. 1, 1994

[54] HIGH DENSITY PLASMA FORMATION USING WHISTLER MODE EXCITATION IN A REDUCED CROSS-SECTIONAL AREA FORMATION TUBE

[75] Inventors: Tihiro Ohkawa, La Jolla; Stanley I. Tsunoda, Encinitas; Robert L. Miller, San Diego, all of Calif.

[73] Assignee: General Atomics, San Diego, Calif.

[21] Appl. No.: 10,553

[22] Filed: Jan. 28, 1993

Related U.S. Application Data

[63] Continuation-in-part of Ser. No. 857,981, Mar. 26, 1992, Pat. No. 5,225,740.

[51] Int. Cl.$^5$ .............................................. H01J 7/24
[52] U.S. Cl. .......................... 315/111.41; 315/111.21; 313/231.31
[58] Field of Search ............ 315/111.41, 111.21, 315/111.71, 111.81; 313/231.31; 204/298.06, 298.37

[56] References Cited

U.S. PATENT DOCUMENTS

| | | | |
|---|---|---|---|
| 3,373,357 | 3/1968 | Keenan et al. | 315/111.41 X |
| 4,101,411 | 7/1978 | Suzuki et al. | 204/219 |
| 4,401,054 | 8/1983 | Matsuo et al. | 118/723 |
| 4,507,588 | 3/1985 | Asmussen et al. | 315/39 |
| 4,585,668 | 4/1986 | Asmussen et al. | 427/38 |
| 4,630,566 | 12/1986 | Asmussen et al. | 118/50 |
| 4,691,662 | 9/1987 | Roppel et al. | 118/50 |
| 4,727,293 | 2/1988 | Asmussen et al. | 315/111.41 |
| 4,745,337 | 5/1988 | Pichot et al. | 315/111.41 |
| 4,810,935 | 3/1989 | Boswell | 315/111.41 |
| 4,876,983 | 10/1989 | Fukuda et al. | 118/722 |
| 4,990,229 | 2/1991 | Campbell et al. | 204/298.06 |
| 5,003,225 | 3/1991 | Dandl | 315/111.41 |
| 5,081,398 | 1/1992 | Asmussen et al. | 315/111.41 |

OTHER PUBLICATIONS

*Plasma Processing of Materials: Scientific Opportunities and Technological Challenges;* National Academy Press, pp. 13–36, (Washington, D.C. 1991) (ISBN 0-309-045-97-5).

Primary Examiner—Robert J. Pascal
Assistant Examiner—Haissa Philogene
Attorney, Agent, or Firm—Fitch, Even, Tabin & Flannery

[57] ABSTRACT

A long plasma formation tube is imbedded in a high magnetic field, with magnetic field lines passing axially through the tube, and with the tube being placed proximate or inside of a resonant cavity. Electromagnetic energy resonates in the resonant cavity representing stored microwave energy. The power density of the stored microwave energy is a function of the cross-sectional area of the resonant cavity. A portion of the stored microwave energy is concentrated to increase its power density, and coupled into the plasma formation tube, which tube has a smaller cross-sectional area than the resonant cavity. The coupled energy excites a whistler wave in the plasma formation tube that forms the plasma within the tube. In one embodiment, the stored microwave power is concentrated by funneling it through a metallic iris that forms one end of the resonant cavity, with a tip of the plasma formation tube being positioned near the metallic iris. In another embodiment, the plasma formation tube is positioned coaxially within the resonant cavity and the stored microwave energy is drawn into the plasma formation tube as plasma begins to form therein because the forming plasma represents a dominant power loss (load) for the stored energy.

20 Claims, 6 Drawing Sheets

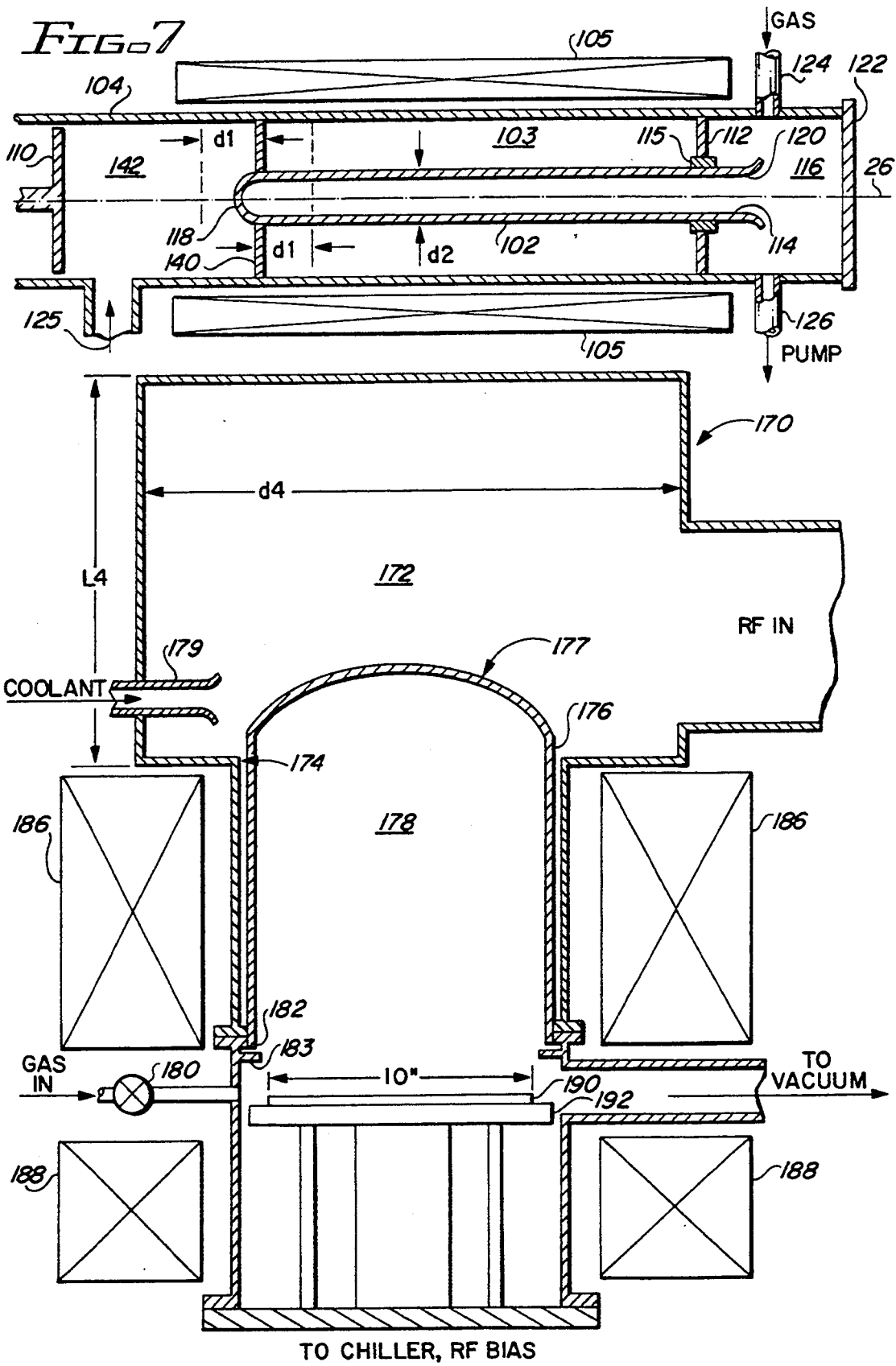

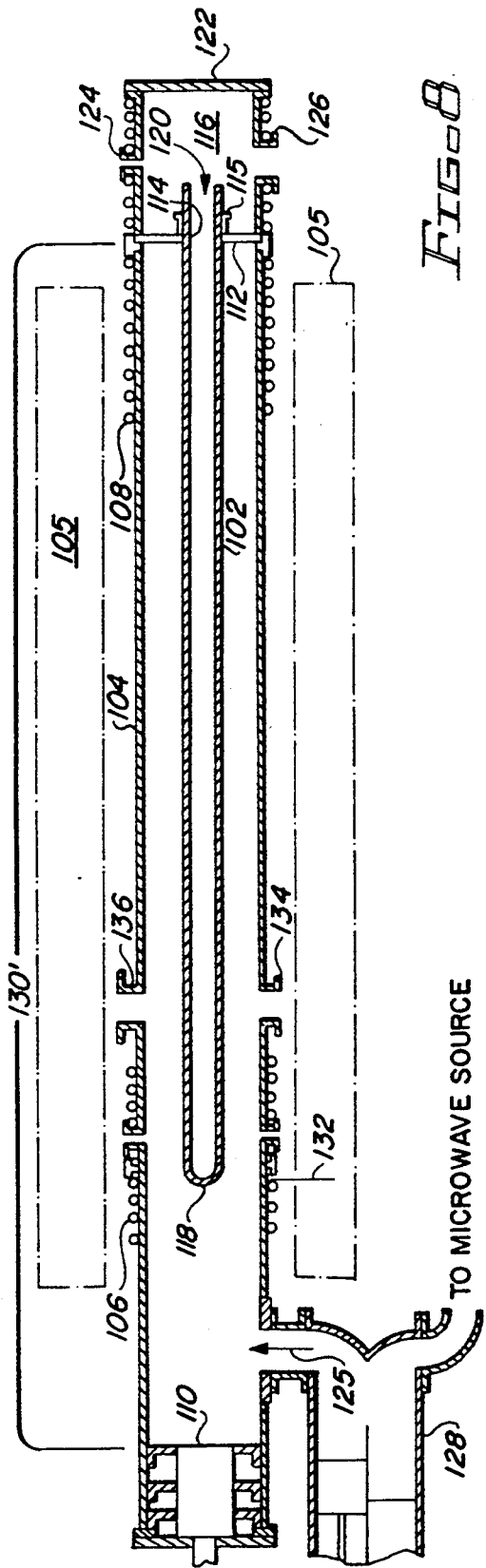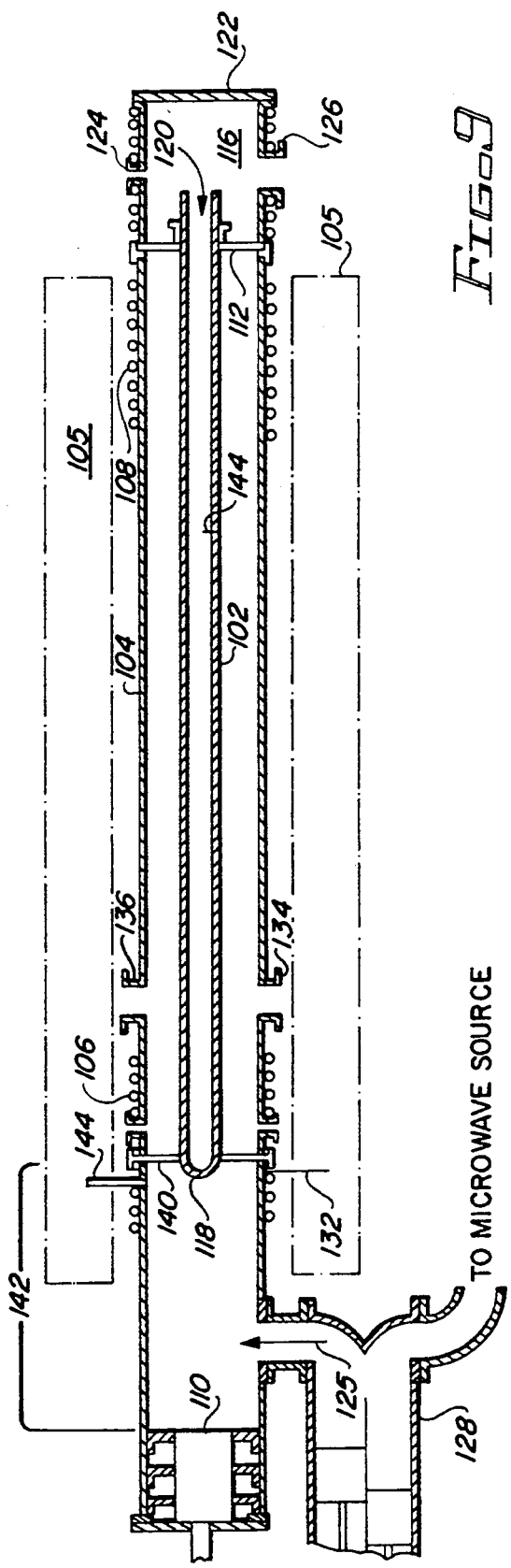

HIGH DENSITY PLASMA FORMATION USING WHISTLER MODE EXCITATION IN A REDUCED CROSS-SECTIONAL AREA FORMATION TUBE

This application is a continuation-in-part of application Ser. No. 07/857,981, filed Mar. 26, 1992 now U.S. Pat. No. 5,225,740.

BACKGROUND OF THE INVENTION

The present invention relates to apparatus and methods for producing high density plasma for use with plasma processing and other applications, such as high power lasers. More particularly, the invention relates to plasma production apparatus and methods that axially or radially excite whistler waves in a cylindrical plasma imbedded in a high magnetic field.

A plasma is an ionized gas. Because a plasma is a gas, it exhibits fluid characteristics that allow it to fill a desired space, assume a specific shape, or otherwise be formed for desired purposes. Because a plasma is an ionized gas, it is electrically conductive, meaning that electrical currents can flow therethrough, and the plasma can be controlled and managed to a certain extent through the application of magnetic and electric fields. Because a plasma is ionized, the ionized atoms and atomic particles therein may be chemically active or energetic, and can thereby also be used to trigger or promote a desired chemical reaction or physical process, e.g., the removal of material, as is done in plasma etching.

Most known applications for using plasma are significantly enhanced if the density of the plasma can be increased and maintained. Disadvantageously, most known techniques for making and maintaining a plasma do not result in a high density plasma. Hence, there is a need in the art for high density plasma production techniques.

There are several ways in which a plasma can be made. One of the most effective ways to make a plasma is to inject microwave energy into a gas. The energy associated with the microwave signal ionizes molecules and atoms in the gas, thereby forming the plasma. Unfortunately, there is a limit to how dense the plasma can become. As the plasma begins to form and become more dense, for example, it also becomes more conductive and starts to appear as an electrical short. Such an electrical short can reflect the microwave signal out of the plasma. Thus, the microwave energy may only be able to penetrate into the plasma a short distance before it is reflected out of the plasma. For this reason, the prior art teaches limiting the thickness of the plasma into which the microwave energy is injected. See, e.g., U.S. Pat. Nos. 4,507,588 (Asmussen et al.); 4,585,668 (Asmussen et al.); 4,691,662 (Roppel et al.); and 4,727,293 (Asmussen et al.); wherein the plasma is confined to a very shallow disk.

Unfortunately, a shallow plasma disk is of limited utility for many plasma processing applications. There are at least two reasons for this. First, the "loss rate" of the plasma in a shallow disk may be higher than the loss rate for a "long" or "deep" plasma. (The "loss rate" of a plasma is the rate at which the plasma is lost either through the ions and electrons in the plasma recombining to form neutral molecules and atoms in the gas or through the ions and electrons hitting the walls of the containment vessel. In the formation of a plasma, an equilibrium point is thus reached where the ion production rate equals the ion loss rate. The loss rate may depend on such factors as the surface to volume ratio.) Second, a shallow plasma disk does not generally provide a sufficient volume of plasma for efficient use in downstream processing applications. Downstream processing applications preferably position the microwave plasma formation apart from the location where the plasma is used. See, e.g., *Plasma Processing Materials, Scientific Opportunities and Technological Challenges*, National Research Council, p. 31 (National Academy Press, Washington D.C. 1991). It would thus be desirable for the plasma volume positioned upstream from the location where the plasma is used to be a relatively large volume, such as a "long" or "deep" plasma cylinder, or equivalent large volume, rather than a relatively small volume, such as a shallow plasma disk. What is needed, therefore, is a technique that allows a microwave signal to be injected into a plasma volume without having the microwave signal reflected back out of the plasma due to the plasma's conductivity, thereby allowing a "deeper" or "longer" plasma volume, and thus a potentially larger plasma volume, to be formed and maintained at a location upstream from the location where the plasma is to be used.

In order to prevent the plasma from shorting out, it is known in the art to immerse the plasma in a strong magnetic field. The strong magnetic field, in general, makes it more difficult for the charged particles within the plasma to cross the magnetic field lines, and thus prevents the charged particles from shorting out. Hence, by orienting the microwave electric field used to create the plasma so that it is perpendicular to the magnetic field in which the plasma is immersed, it is possible to prevent the shorting of the plasma, and thereby improve the density limit of the plasma. U.S. Pat. Nos. 4,101,411 (Suzuki et al.); 4,401,054 (Matsuo et al.); 4,810,935 (Boswell); and 4,876,983 (Fukuda et al.) are all examples of prior art apparatus and devices that utilize microwaves and a magnetic field for various plasma processing operations.

However, even when a magnetic field is used to prevent the plasma from shorting, the injected microwave signal is still subject to damping, and such damping imposes a further density limit on the plasma. What is needed, therefore, is a technique for injecting microwaves into a plasma while increasing the density limit imposed by the damping of the microwave signal.

Two sources of damping have been identified in the prior art. The first is collisional damping, caused by collisions between electrons associated with the injected microwave energy and the ions and neutral gas molecules present in the plasma. The more dense the ions or molecules in the plasma, the more collisions that occur, and the more difficult it is for the wave to penetrate further into the plasma. Collisional damping is believed to be the factor that has heretofore limited the available plasma density in the prior art devices. See, e.g., U.S. Pat. No. 4,990,229 (Campbell et al.), where the use of an excitation frequency of 13.56 MHz for the microwave energy creates a collision frequency on the order of $2.5 \times 10^8$ sec$^{-1}$. Such a collision frequency corresponds to a plasma density of about $10^{19}$ m$^{-3}$ ($10^{13}$ cm$^{-3}$). It would be desirable if a plasma density greater than $10^{13}$ cm$^{-3}$ could be achieved.

The second source of damping is collisionless damping, also known as Landau damping. Landau damping results when the particles in the plasma have a velocity nearly equal to the phase velocity of the microwave signal injected into the plasma. The theory is that because the particles in the plasma travel with the microwave signal, they do not see a rapidly fluctuating electric field, and hence can effectively exchange energy with the microwave signal. Further, although there are electrons in the plasma that travel faster and slower than the microwave signal, the distribution of electrons is such that there are more slow electrons than fast electrons. Hence, there are more particles taking energy from the microwave signal than adding to it, and the microwave signal becomes quickly damped. Landau damping is best controlled by assuring that the phase velocity of the injected microwave signal is sufficiently larger than the thermal velocity of the particles in the plasma.

It is known in the art to use a so called "whistler wave", also known as a helicon wave, in a plasma producing apparatus. See, e.g., U.S. Pat. No. 4,990,229 (Campbell, et al.). A whistler wave propagates along the magnetic field lines. Its frequency should be much less than the electron cyclotron frequency, $\omega_{ce}$. (The electron cyclotron frequency, $\omega_{ce}$, is equal to $eB/mc$ where e and m are the electron charge and mass, respectively; B is the magnetic field strength; and c is the speed of light.) In order to excite the desired whistler wave in the plasma, Campbell, et al. show particular types of antenna configurations used to surround the plasma chamber of a given plasma processing device. These antenna configurations are determined by the frequency of the rf excitation that is used, which Campbell, et al. teach, must be a low frequency, e.g. 13.56 MHz. Collisional damping thus remains the limiting factor for configurations such as those shown in Campbell et al. Hence, what is needed is a means of exciting plasma, e.g., by using whistler mode microwave signals, in a way that increases the density limit caused by collisional damping.

The present invention advantageously addresses the above and other needs.

SUMMARY OF THE INVENTION

The present invention provides apparatus that creates a high density plasma in a long cylindrical cavity. As used herein, the term "high density plasma" refers to a plasma having a density in excess of about $10^{12}$ cm$^{-3}$. The cylindrical cavity, and hence the plasma, is imbedded in a high magnetic field, with magnetic field lines passing axially (longitudinally) through the cavity.

In one embodiment, electromagnetic radiation is coupled axially into the cylindrical cavity using a resonant cavity in order to excite a whistler wave in the cylindrical cavity, and hence in the plasma. In another embodiment, electromagnetic radiation is coupled radially into the cylindrical cavity using a slow wave structure in order to excite the whistler wave in the plasma. In either embodiment, the plasma is advantageously created without using electrodes; and the excitation of the whistler wave is achieved at a high Q value, thereby allowing radio frequency (rf) power to be transmitted into the plasma at a good efficiency. For purposes of the present application, the definition of "Q" is that 1/Q is proportional to the fraction of energy lost per cycle of oscillation. Thus, if Q is large, a larger amount of energy may be stored in the resonant cavity. By "high Q" value, it is meant that the Q of the resonant circuit or cavity in the absence of a plasma must be high enough so that the dominant power loss will be to the plasma.

In accordance with one aspect of the invention, various geometries are provided for coupling energy between the resonant cavity and the plasma. Such varied geometries advantageously allow the invention to be used for numerous applications, for example, plasma processing applications, such as plasma etching, stripping or deposition; high power laser excitation applications; ion source applications; or sputtering gun applications.

For plasma processing applications, such as plasma etching, stripping or deposition, the invention provides the requisite coupling between a resonant cavity and a plasma column. A strong magnetic field is axially applied to the plasma column. The magnetic field has an electron cyclotron frequency $\omega_{ce}$ associated therewith ($\omega_{ce}=eB/mc$, as previously described). A whistler wave having a sufficiently high frequency, $\omega$, e.g., $\omega/2\pi=2.45$ GHz, is excited in the plasma column. Advantageously, the use of the whistler wave at such a high frequency increases the limiting collision frequency, thereby increasing the achievable plasma density. However, the use of higher frequencies and densities requires a totally different excitation geometry from that used in the prior art. The present invention advantageously provides such different excitation geometries. In a preferred geometry, for example, axial coupling is provided between a resonant cavity and the plasma column, with the resonant cavity being positioned at one end of the plasma column. In an alternative geometry, multiple loop structures are placed within the plasma chamber in order to radially excite the desired whistler wave in the plasma. Advantageously, such geometries yield plasma densities well in excess of those achievable using prior art devices. Further, the use of the resonant cavity allows for a high Q-value, thereby providing for the efficient coupling of rf energy into the plasma.

For high power laser applications, an axial excitation is inconvenient because it interferes with the optical system, which optical system typically utilizes two facing mirrors between which the lasing medium resonates. Hence, the present invention provides that the whistler wave is excited with a radial excitation geometry that comprises a microwave cavity with periodically slotted gaps that surround a cylindrical plasma chamber. The spacing of the gaps is determined by the wavelength of the excited mode.

For high density ion source applications, accelerating grids are placed at the end of the plasma column in either a radially or axially excited system to create a high density ion beam.

For sputtering gun applications, a sputtering target is placed in front of the grids of a high density ion source. The ion beam may then be directed towards the target, thereby creating a high density sputtering apparatus.

In accordance with another aspect of the invention, alternate geometries are provided that concentrate the microwave power available in the high-Q resonant cavity into a smaller cross-sectional area. Such concentrated microwave power thus provides an increased power density which can advantageously be directed into a plasma column having a correspondingly smaller cross-sectional area, causing a whistler wave to be excited therein that produces a higher density plasma than could be produced otherwise.

One geometry, for example, useful for producing high density plasma, coaxially places a plasma formation tube inside of the resonant cavity. The plasma formation tube comprises, e.g., a quartz tube having a prescribed gas at a prescribed pressure therein. The resonant cavity comprises a conductive cylindrical chamber, bounded at one end by an adjustable conductive plunger, and at the other end by a conductive end plate. The cylindrical chamber has a larger cross-sectional area than the plasma formation tube. Microwave power at a high frequency, e.g., 2.45 GHz, is injected into the cylindrical chamber and allowed to resonate. Such power has an initial power density that is a function of the cross-sectional area of the cylindrical chamber. Some of the power begins to ionize the prescribed gas in the plasma formation tube, thereby starting the formation of a plasma. As the plasma forms, it becomes the dominant power loss (load) for the resonating microwave power. Such power loss draws additional microwave power into the plasma formation tube, thereby effectively concentrating the microwave power within the narrower cross-sectional area of the plasma formation tube, thus increasing the power density. The resulting increased power density advantageously sustains the formation of an increased density plasma within the plasma formation tube.

An alternate geometry, also useful for promoting the formation of a high density plasma in accordance with the present invention, coaxially aligns a narrow plasma formation tube with an adjacent, axially aligned, resonant cavity. The resonant cavity has a cross-sectional area that is larger than the cross-sectional area of the plasma formation tube. Microwave power at a high frequency, e.g., 2.45 GHz, is injected into the resonant cavity and allowed to resonate. A tip of the plasma formation tube is positioned near one end of the resonant cavity. Prior to plasma formation, the resonating microwave power penetrates evanescently into just the tip portion of the plasma formation tube. Such power starts the plasma formation process and excites a whistler wave in the plasma formation tube. As the plasma forms, it presents a significant power loss (load) to the resonating microwave power in the resonant cavity, thereby drawing additional power into the tip of the plasma formation tube. This action effectively concentrates the power from the cross-sectional area of the resonate cavity to the smaller cross-sectional area of the plasma formation tube. Such concentrated power is then able to be carried further into the plasma formation tube by the whistler wave, thereby creating a higher density plasma than could otherwise be achieved.

Variations of the above two coaxial geometries provide useful apparatus for a plasma applicator used, e.g., for ion implantation, ion beam milling, ion-assisted deposition, or plasma etching devices and/or systems.

It is significant to note that the above two coaxial geometries are not equivalent to simply using a smaller diameter conductive plasma formation tube. For a given microwave frequency, the dimensions of the resonant cavity cannot decrease the cross-sectional area, determined e.g., by the diameter of the resonant cavity, below a cut-off cross-sectional area, e.g, a cut-off diameter. The coaxial geometries of the present invention advantageously allow the diameter of the plasma formation tube to be smaller than the cut-off diameter of the resonant cavity, thereby allowing increased power densities and hence an increased plasma density to be achieved.

It is thus seen that one feature of the present invention, in accordance with the above-described two geometries, is to provide plasma production apparatus that produces high density plasma by concentrating resonant microwave power from a relatively large cross-sectional area of a resonant cavity down to a smaller cross-sectional area of a plasma formation tube.

Another feature of the invention is to provide apparatus and methods for producing dense plasma usable in a wide variety of applications, such as plasma processing, e.g., plasma etching, stripping or deposition; lasers; ion sources; or sputtering guns.

It is a further feature of the invention to provide configurations or geometries wherein microwave or other rf energy can be transmitted to penetrate into a gas confined within a suitable "long" cavity while allowing a high density plasma to be formed within the cavity. In particular, it is a feature of the invention to provide such apparatus and geometries wherein high frequency microwave energy, e.g., greater than 1 Ghz, may be coupled into the plasma so as to excite a whistler wave therein, which high frequency whistler wave advantageously allows for a much higher plasma density.

It is an additional feature of the invention to provide a technique for axially or radially exciting high frequency whistler waves in a cylindrical plasma imbedded in a high magnetic field.

It is yet a further feature of the invention to provide a means for exciting plasma without using electrodes.

It is still an additional feature of the invention to provide a means of exciting a whistler wave in a cylindrical plasma through the use of a resonant cavity.

BRIEF DESCRIPTION OF THE DRAWINGS

The above and other aspects, features and advantages of the present invention will be more apparent from the following more particular description thereof, presented in conjunction with the following drawings wherein:

FIG. 7 diagrammatically illustrates plasma production apparatus made in accordance with a preferred embodiment of the invention wherein a relatively narrow plasma formation tube is placed coaxially inside of a larger conductive tube, with a significant portion of the larger tube serving as a resonant cavity for the microwave power;

FIG. 8 diagrammatically illustrates one variation of the apparatus shown in FIG. 7 wherein substantially the entire length of the larger conductive tube serves as the resonant cavity;

FIG. 9 diagrammatically illustrates another variation of the apparatus shown in FIG. 7 wherein one end of the conductive tube serves as the resonant cavity;

FIG. 11 diagrammatically shows a plasma etcher made in accordance with the embodiment of the invention depicted in FIGS. 7 and 9.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

As indicated above, the present invention relates to the production of a high density plasma by axially or radially exciting whistler waves (one form of rf energy) in a cylindrical plasma imbedded in a high magnetic field. The strength of the magnetic field is sufficiently high so that the electron cyclotron frequency is several times greater than the wave frequency. In general, two conditions must be met in order to produce a high density plasma. First, a wave of rf energy must be transmitted so as to propagate into the plasma, thereby causing the requisite discharge to occur that creates and maintains the plasma. Second, once transmitted, the wave must not damp too quickly. A whistler wave advantageously does not have a high density cutoff associated therewith. Hence, such wave can easily penetrate into the plasma to sustain the requisite discharge, thereby fulfilling the first condition. The second condition means that the rf frequency must be higher than the electron collision frequency with the plasma ions and the neutral gas molecules, and the wave must not experience excessive collisionless damping. Hence, the second condition may be satisfied largely through the proper selection of the rf frequency for the particular application at hand.

As will be evident from the description that follows, the present invention provides specific geometries that may be used to excite rf energy in the form of a whistler wave in a deep or long plasma cavity, thereby promoting the formation and maintenance of high density plasma within such cavity. Both the geometry of the launcher and the geometry of the plasma cavity are important. Such geometries will vary somewhat depending upon the particular application for which the plasma is being used.

Figure 1:
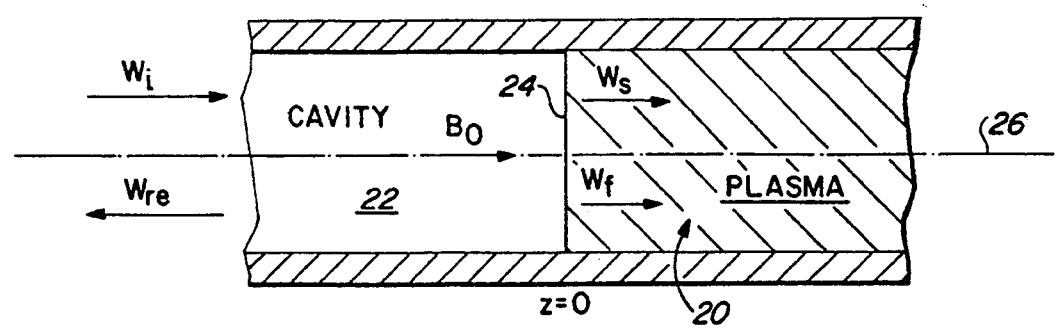
FIG. 1 illustrates the interface between a microwave cavity and a plasma, and schematically depicts how an input wave excites both slow and fast waves in the plasma, as well as reflects from the plasma interface.
Figure 2A:
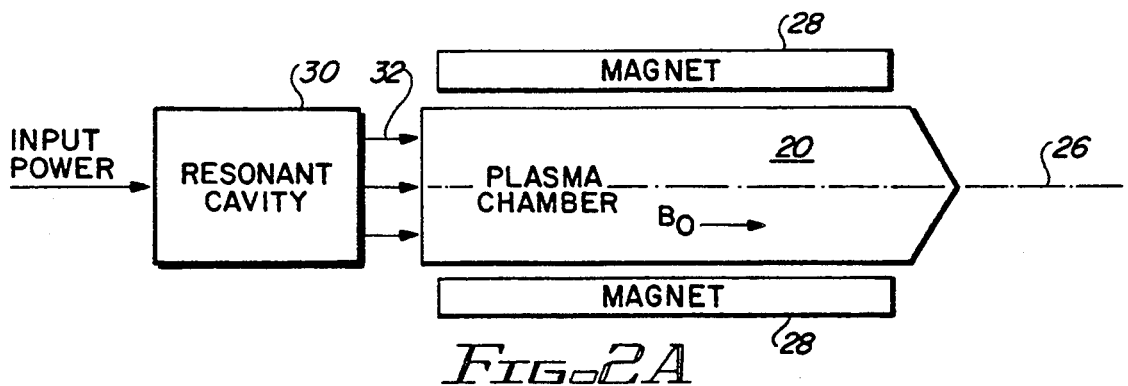
FIG. 2A shows a preferred configuration for axially coupling rf energy into a plasma chamber so as to excite a whistler wave therein.
Figure 2B:
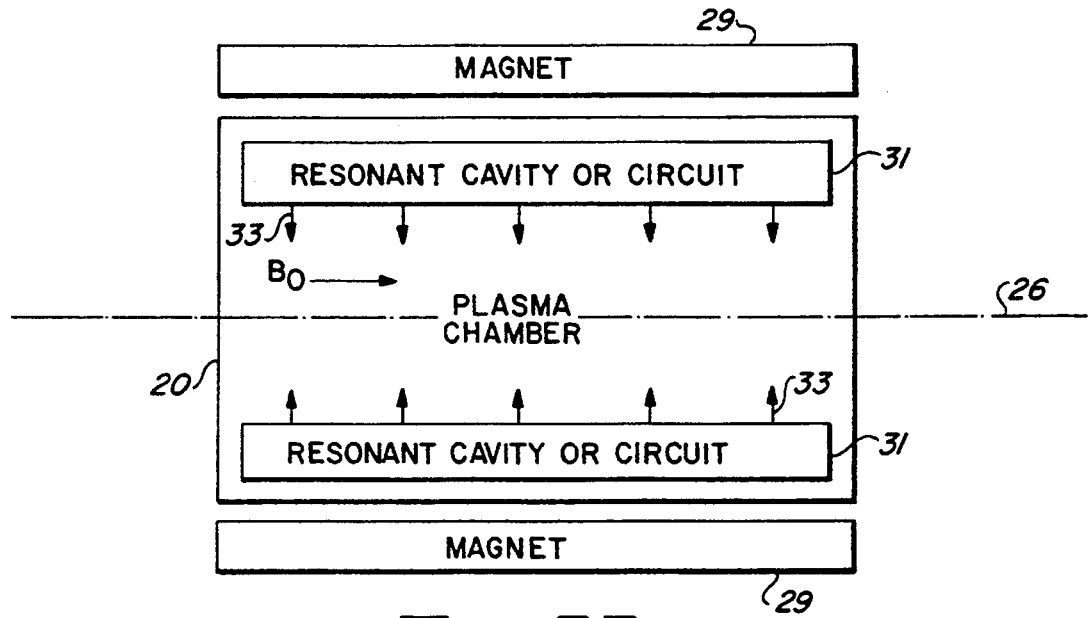
FIG. 2B similarly shows a preferred configuration for radially coupling rf energy into a plasma chamber so as to excite a whistler wave therein.

Before describing some of the preferred geometries associated with the invention, it will be helpful to first present a brief overview of some basic concepts applicable to the coupling of rf energy into a plasma chamber. The description presented below in connection with FIGS. 1, 2A and 2B is intended to provide such a brief overview. A mathematical analysis of such coupling principles may be found in Appendix A of U.S. patent application Ser. No. 07/857,981, filed 03/26/92, of which the present application is a continuation-in-part. The '981 application, including Appendix A, is incorporated herein by reference. A good overview of the role plasma processing now plays, and will play in the years to come, may be found in *Plasma Processing of Materials, Scientific Opportunities and Technological Challenges,* National Research Council (National Academy Press, Washington, D.C. 1991).

Referring first to FIG. 1, a plasma chamber 20 is shown adjacent a microwave cavity 22. An interface 24 separates the microwave cavity 22 from the plasma chamber 20. The interface 24 is located (assuming an appropriate coordinate system having a z-direction that is horizontal for the orientation shown in FIG. 1) at z=0. In general, the plasma chamber 20 is cylindrically shaped, having a longitudinal axis 26 passing through the center thereof in the z-direction, thereby allowing the formation of a "deep" or "long" plasma (as compared to a shallow or thin disk-shaped plasma, as described in the prior art). A deep or long plasma is important because it provides a larger plasma mass having a lower loss rate, thereby giving rise to a higher density plasma. In addition, a deep or long plasma better provides for the possibility of downstream plasma processing. Note that as shown in FIG. 1, the microwave cavity 22 is aligned with the longitudinal axis 26 of the plasma chamber.

In order to couple rf energy into the plasma chamber, an input wave $W_i$ is excited in the microwave cavity 22, or equivalent rf energy source, so as to propagate in the z-direction towards the plasma chamber 20. The presence of a strong magnetic field $B_0$, having lines of force that are substantially parallel to the longitudinal axis 26, helps guide the input wave $W_i$ in the desired direction, and further helps confine the plasma within the plasma chamber 20. As explained more fully in Appendix A, if a high density plasma is to be produced, it is important that the electron cyclotron frequency (associated with the magnetic field $B_0$) be much larger than the wave frequency (associated with the whistler wave), and that the wave frequency, in turn, be larger than the collision frequency (associated with the creation and maintenance of the plasma).

The input wave $W_i$, upon encountering the interface 24, excites a slow wave $W_s$ and a fast wave $W_f$ in the plasma. The fast wave is cut off at high density. The slow wave continues to propagate in the z-direction. A portion of the wave $W_i$ is also reflected from the interface as a wave $W_{re}$. The present invention describes various geometries suitable for directing the input wave $W_i$ into the plasma chamber 20 so that the desired slow wave $W_s$, or whistler wave, is launched in the plasma chamber. The energy associated with the slow wave, or whistler wave, is then efficiently transferred to the gas in the plasma chamber 20 in order to ionize the gas, thereby forming the desired plasma. The plasma thus formed is then available for use for a desired application.

A preferred approach for launching or coupling rf energy into the plasma chamber in order to excite the desired whistler wave is illustrated in FIGS. 2A and 2B.

In FIG. 2A, such launching involves axially coupling the microwave energy into the plasma chamber in order to excite the desired whistler wave. In FIG. 2B, such launching involves radially coupling the microwave energy into the plasma chamber in order to excite the desired whistler wave.

Referring to FIG. 2A, a resonant cavity 30 is positioned at one end of the plasma chamber 20. Appropriate input power is directed into the resonant cavity 30 so as to excite a resonant condition, which resonant condition is manifest by the presence of a resonant signal. A resonant condition advantageously assures that reflected energy is not wasted, but rather goes back into the resonance for later use. This is especially true when a high Q resonance exists. The resonant signal may comprise an appropriate microwave signal, e.g., of the $TE_{01}$ or $TE_{11}$ modes, which when it enters the plasma chamber 20 launches the desired whistler wave in the plasma. The resonance of the cavity operates at a high Q value, thereby allowing a portion 32 of the energy associated with the resonant signal to be efficiently coupled into the plasma chamber 20. As further seen in FIG. 2A, a suitable magnetic field generating means 28, which may comprise a coil wound around the plasma chamber 20, generates the requisite magnetic field $B_0$ needed to help sustain the production of the high density plasma.

Similarly, referring to FIG. 2B, an annular resonant structure 31 is positioned around the periphery of the plasma chamber 20. Appropriate input power is directed into the resonant structure 31 so as to excite a high Q resonant condition, which resonant condition is manifest by the presence of a resonant signal. Such resonant signal may comprise an appropriate microwave signal, e.g., of the $TE_{01}$ or $TE_{11}$ modes, which excites the desired axially traveling whistler wave in the plasma. The magnetic and electrical fields at the boundary of the plasma chamber 20 that are created by the resonant electrical current excite the desired axially traveling whistler wave in the plasma. The resonance of the cavity operates at a high Q value, thereby allowing a portion 33 of the energy associated with the resonant signal to be efficiently coupled into the plasma chamber 20. As further seen in FIG. 2B, a suitable magnetic field generating means 29, which may comprise a coil wound around the plasma chamber 20, generates the requisite magnetic field $B_0$ needed to help sustain the production of the high density plasma.

Figure 3:
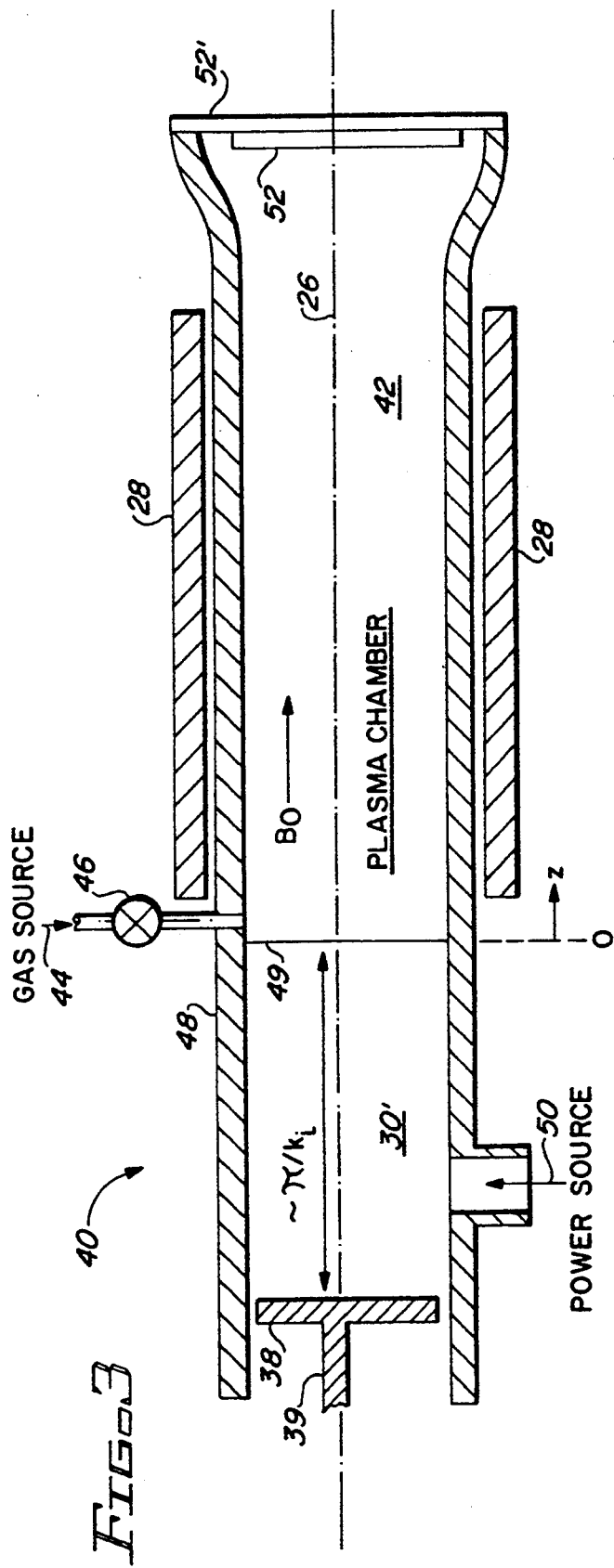
FIG. 3 diagrammatically illustrates a plasma processing device made in accordance with the present invention utilizing the axial coupling shown in FIG. 2A.

Turning next to FIG. 3, a diagrammatic illustration of a plasma processing device 40 made in accordance with the present invention is shown. The device 40 represents one particular geometry that may be used to axially launch a whistler wave into a plasma chamber 42. As seen in FIG. 3, the plasma chamber 42 comprises a cylindrical chamber 42 coupled to a suitable source of gas 44 through an inlet valve 46. The side walls 48 of the plasma chamber 42 may be made from any suitable material, and are preferably simply an extension of the walls of a resonant cavity 30'. A window 49, which may be made of any suitable material through which microwave energy may readily propagate, such as fused quartz (glass), separates the plasma chamber 42 from the resonant cavity 30'. The resonant cavity 30' may be of conventional waveguide construction, having conductive walls 48. The waveguide construction is preferably a circular waveguide. However, it is to be understood that the waveguide construction may be a generalized cylinder. That is, the waveguide structure could be a rectangular waveguide or any other single conductor waveguide of constant cross sectional shape and size relative to the cylindrical axis 26.

As indicated above, adjacent one end of the plasma chamber 42, and still within the waveguide construction 48 (and preferably as part of the waveguide construction 48) is an adjustable resonant cavity 30'. The adjustable resonant cavity has a movable end plate 38 at the end thereof opposite the plasma chamber 42. The movable end plate 38, in turn, is coupled to an adjustable plunger 39. The plunger 39 may be selectively 30 adjusted back and forth in the z-direction in order to tune the cavity 30' to a desired resonant condition, in conventional manner.

For the desired resonant condition, the length of the cavity 30' is adjusted to be equal to approximately $\pi/k_i$, where $k_i$ is the wave number of the desired waveguide mode for the microwave resonance. The desired resonant condition excites a microwave signal in the appropriate mode having a frequency preferably greater than 1 GHz, such as 2.45 GHz. Input power 50 is coupled into the cavity 30' from a suitable input power source (not shown) in conventional manner to establish the resonant condition in the cavity 30' at a high Q value. The cavity can either be at high vacuum or at atmospheric pressure. A coil 28, or equivalent magnetic field generating means, is wound around the plasma chamber 42 in order to provide the requisite magnetic field $B_0$. A mathematical description of the excitation of a resonant microwave signal in the resonant cavity 30', and the coupling of the energy associated with such microwave signal into the plasma chamber 42 in order to launch the desired whistler wave in the plasma is provided in Appendix A of the '981 application, referenced above.

As an example of apparatus built in accordance with FIG. 3, a tunable resonant cavity is made from circular waveguide having an inner diameter of about 8.6 cm and a length of about 30 cm. A window 49 made of silicon quartz is placed in the waveguide in order to create a boundary between the resonant cavity and a plasma chamber. The plasma chamber is made from the same waveguide structure, having an inner diameter of about 8.6 cm and a length of about 50 cm. A mixture of argon and $CH_4$ gas is injected into the plasma chamber. The partial pressures of these gases are on the order of 10 millitorr. An axial magnetic field $B_0$ of approximately 0.5 Tesla is established in the plasma cavity. A wave of 2.45 GHz of the $TE_{11}$ mode is set up as a resonant signal in the resonant cavity. For the $TE_{11}$ example, as set forth in more detail in Appendix A, it is required that the vacuum free space wavelength, $\lambda$, satisfy the relationship $\lambda < 2\pi a/\lambda'_{11}$, where a is the waveguide radius and $\lambda'_{11}$ is the first zero of $J'_1$, where $J'_1$ is the derivative of the 1st order Bessel function of the first kind. The waveguide radius, a, is the relevant physical dimension, and for the present example is 4.3 cm. $\lambda'_{11}$ is a constant (equal to 1,842). The vacuum free space wavelength, $\lambda$, is (at a frequency of 2.45 GHz) equal to 12.2 cm. Hence, the condition set forth above ($\lambda < 2\pi a/\lambda'_{11}$) is satisfied. The resonance condition in the present example, as set forth above, requires that the waveguide wavelength, $\lambda_g$, which is equal to $2\pi/k_i$, be equal to twice the cavity length. Since the free space wavelength is always less than the waveguide wavelength (as described in Appendix A of the '981 application), the vacuum free space wavelength is always less than twice the cavity length. These conditions are what is meant herein when it is said that the vacuum wavelength must be less than the linear dimensions of the cavity. The wave power is 3 kW. The resonant cavity has an unloaded Q value of about 5000. The density of the plasma formed in the plasma chamber as a result of the microwave energy coupled into the plasma chamber has a density of approximately $10^{14}$ cm$^{-3}$. Higher density plasmas are achievable using, inter alia, a stronger magnetic field.

The geometry shown in FIG. 3 is best suited for high density plasma processing applications. For example, a workpiece 52 that is to be etched by the high density plasma may be positioned near the end of the chamber 42 opposite the resonant cavity 30'. Conventional means may be used to direct the plasma to the workpiece to control its flow so as to etch the workpiece 52 in a desired pattern. Etching of the workpiece occurs, for example, when the plasma streams along the magnetic field lines in the plasma chamber and strikes the workpiece, thereby depositing kinetic energy that heats and etches the workpiece. The workpiece 52 may be attached to an end plate 52' of the chamber 42, or it may be positioned some distance downstream from the chamber 42, depending upon the application. The workpiece need not have the same approximate cross sectional area as the chamber 42, as the plasma can be spread out or narrowed by application of appropriate magnetic fields. For some applications, the workpiece, in conventional manner, may be masked with appropriate materials that protect certain areas of the workpiece and expose other areas, with the exposed areas being those that are to be etched.

Alternatively, instead of a workpiece 52 and end plate 52', a set of accelerating grids may be placed at the end of the plasma chamber 42 to produce a high density ion beam. A high density sputtering gun may also be realized by inserting a target in front of the accelerating grids.

Advantageously, the high density plasma that is produced using the geometry shown in FIG. 3 makes possible the very rapid etching of extremely fine patterns. Further, for similar applications, requiring a plasma enhanced chemical vapor deposition (PCVD), plasma sputtering, or reactive sputter deposition, a high plasma density, such as is available with the geometry shown in FIG. 3, significantly speeds up the processing operation. An increased processing speed is made possible because the dissociation and activation rates (in PCVD), the sputter rate (in plasma sputtering), and the chemical reaction rate (in reactor sputter deposition) are all proportional to the plasma density. See, e.g., H. Yasuda, Plasma Polymerization, Academic Press, 1985.

It is to be noted that axial coupling of the microwave energy so as to launch the whistler wave in the plasma chamber is not the only launching mechanism that may be used. Radial coupling of the microwave energy is also possible. Slow wave structures that promote radial coupling, and that include multiple loop geometries are illustrated in FIGS. 4A–5B. It is noted that in a waveguide containing a plasma, as seen in FIG. 1, there are fast waves $W_f$ and slow waves $W_s$. The fast waves are cut off in the presence of high density plasma. The slow waves remain. The slow wave is the desired whistler mode. Hence, in order to radially launch a whistler wave in the plasma cavity, a suitable slow wave structure may be used.

Figure 4C:
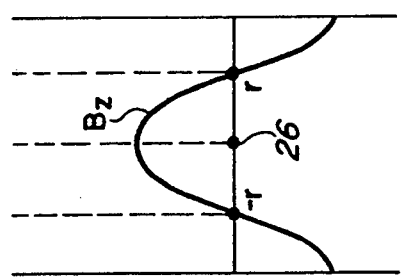
FIG. 4C depicts a cross sectional profile of the axial magnetic field component associated with the structure of FIG. 4A.
Figure 4B:
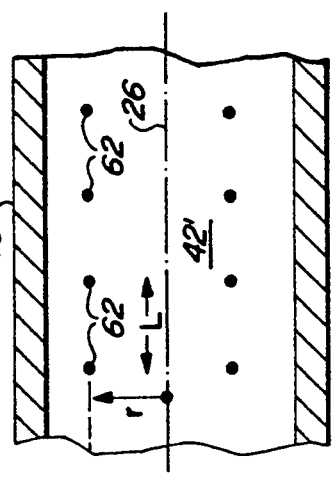
FIG. 4B shows a longitudinal cross section of the structure of FIG. 4A.
Figure 4A:
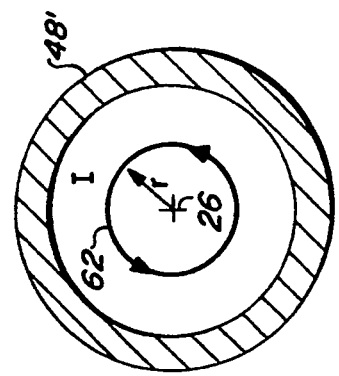
FIG. 4A shows a perpendicular cross section of a $TE_{01}$ slow wave structure that may be used to radially excite a whistler mode in a plasma processing device in accordance with the present invention.

Referring to FIG. 4A, for example, there is shown a perpendicular cross section of a slow wave structure that may be used to radially excite the $TE_{01}$ whistler mode in the plasma chamber. FIG. 4B shows a longitudinal cross section of the structure of FIG. 4A; and FIG. 4C depicts a cross sectional profile of the magnetic field intensities associated with the structure of FIG. 4A. The magnetic field produced by the loop is designed to match the magnetic field of the desired $TE_{01}$ waveguide mode. Accordingly, the loop radius is determined by the radius at which $B_z=0$ for the mode. Similarly, FIG. 5A shows a perpendicular cross section of another slow wave structure that may be used to radially excite the $TE_{11}$ whistler mode in the plasma chamber; while FIG. 5B shows a longitudinal cross section of the structure of FIG. 5A.

Referring first to FIGS. 4A and 4B, the desired slow wave structure includes a circular waveguide structure 48' centered about a longitudinal axis 26. The waveguide structure 48' has a plurality of loops 62 positioned therewithin at a radius "r". The interior of the waveguide structure 48' functions as a plasma chamber 42'. The loops 62 are evenly spaced along the chamber 42' in the z-direction (longitudinal direction) so as to periodically load the waveguide, thereby promoting the formation of the desired slow (whistler) wave at a wavelength that is related to the loop spacing "L". An electrical current "I" flows in each of the loops.

The cross sectional profile of the axial magnetic field (B-field) $B_z$ in the radial direction for the structure of FIG. 4A is shown in FIG. 4C. Note that the B-field is a maximum of one polarity at the interior wall surface, and a maximum of the other polarity in the center of the waveguide, and is zero at the radial location of the loop 62.

Figure 5A:
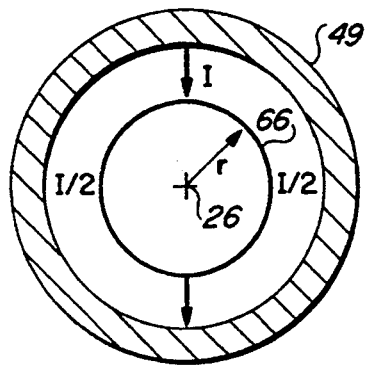
FIG. 5A shows a perpendicular cross section of a $TE_{11}$ slow wave structure that may be used to radially excite a whistler mode in a plasma processing device in accordance with the present invention.
Figure 5B:
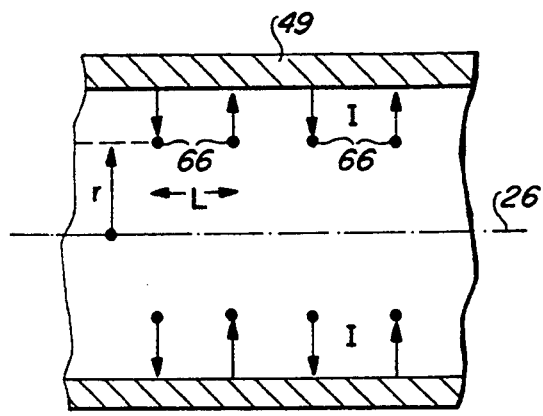
FIG. 5B shows a longitudinal cross section of the structure of FIG. 5A.

FIGS. 5A and 5B show an alternative slow wave structure suitable for exciting the $TE_{11}$ mode. The circular waveguide structure 49 is similar to that shown in FIGS. 4A and 4B. That is, periodically spaced loops 66 are placed within the waveguide structure 49 so as to reside inside the plasma chamber. As seen best in FIG. 5A, a current "I" flows in each loop 66, as shown in FIG. 5A, with the current splitting between two halves of the loop. (The current flow direction is indicated by the direction of the arrowheads applied to the loop 66.) However, as seen in FIG. 5B, the direction of the current flow is different for adjacent loops, with the current flowing in a first loop from the top of the waveguide structure 49 to the bottom, and the current flowing in an adjacent loop from the bottom of the waveguide structure to the top.

The launching geometries shown above in FIGS. 3–5B are best suited for high density plasma processing applications, as discussed above. This is because the axial or radial coupling frees up at least one end of the plasma chamber for extracting or using the plasma for its desired purpose. Numerous other applications would benefit from the existence of a high density plasma. For example, all gas lasers require some means for exciting the lasing medium (a gas). For high power lasers, it is necessary to produce a high excitation rate of the lasing medium. A high density plasma advantageously provides a convenient mechanism in such a laser for producing the requisite high excitation rate. Thus, another application for the high density plasma produced by the present invention is to excite the lasing medium of a high power gas laser.

Unfortunately, the axial excitation of a laser is not convenient because it interferes with the optical system associated with the laser. However, radial excitation may be used. A preferred geometry that may be used in accordance with the present invention to radially excite a whistler wave in a laser gas medium is diagrammatically illustrated in FIG. 6.

Figure 6:
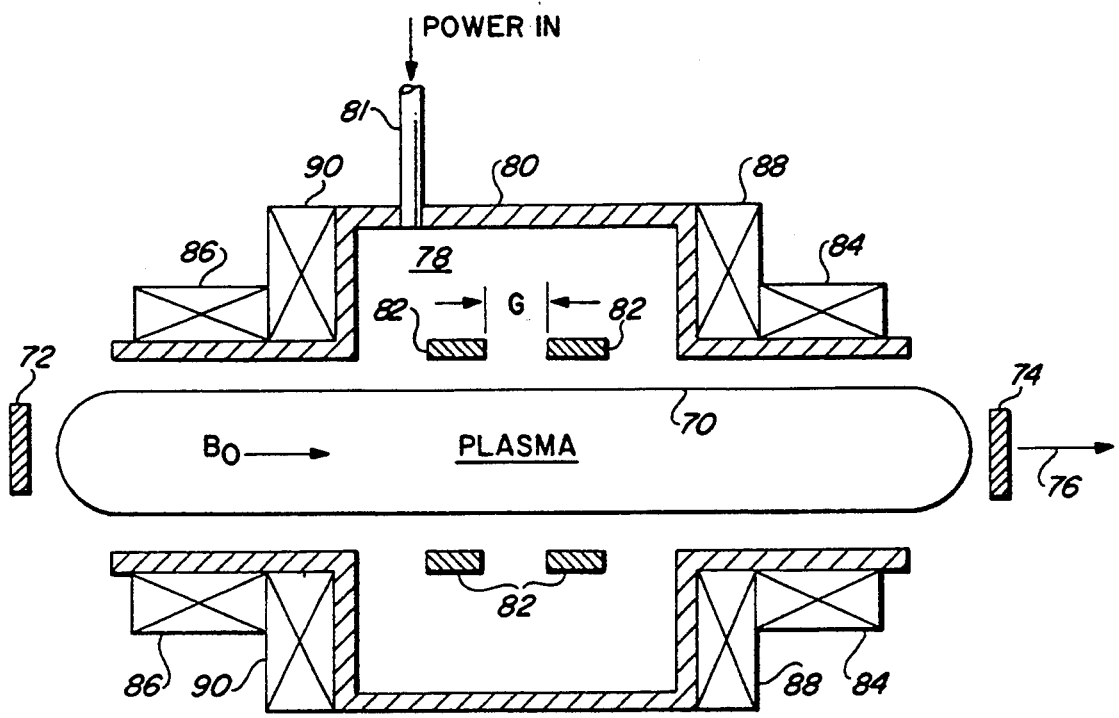
FIG. 6 diagrammatically illustrates a slotted resonant cavity used to radially excite a whistler wave in a high power gas laser.

As shown in FIG. 6, a cylindrical plasma chamber 70 is positioned between two reflective surfaces (mirrors) 72 and 74. For laser operation, at least one of the mirror surfaces, e.g., the mirror 74, is partially transmissive, thereby allowing the laser output 76 to be used for a desired purpose. The plasma chamber 70 is typically made from a quartz tube. As depicted in FIG. 6, the plasma chamber 70 is centered within a cavity 78 that includes an outer wall 80 and inner rings 82. The outer wall and inner rings function as a microwave cavity with periodically slotted gaps. The spacing of the gaps, i.e., the spacing "G" between the rings 82 is determined as a function of the wavelength of the excited mode. For the geometry shown in FIG. 6, it is assumed that the excited mode is a whistler wave in the microwave region, e.g., having a frequency greater than about 1 GHz.

Four sets of coils 84, 86 and 88, 90, or equivalent, surround the cavity 78 on the outside of the wall 80. In combination, the coils 84, 86, 88 and 90 provide a uniform B-field within the plasma chamber 70. The excited whistler wave, in combination with the uniform B-field, promote the formation of high density plasma within the chamber 70, which high density plasma allows the laser operation to take place.

Turning next to FIG. 7, a particular geometry useful for producing high density plasma in accordance with the present invention is illustrated. The geometry includes a pyrex or fused quartz tube 102 that is coaxially positioned within a larger-diameter conductive tube or chamber 104. The larger-diameter tube 104 is made from a conductive material, such as copper. Magnetic coil 105 creates a magnetic field having field lines that axially pass through the conductive chamber 104, including the inner tube 102. An axially adjustable plunger 110 is positioned at one end (the left end, as shown in FIG. 7) of the chamber 104. A conductive end plate 112 is positioned near the other end (the right end, as shown in FIG. 7) of the chamber 104. The end plate 112 has an opening 114 in the center thereof through which the narrow inner tube 102 passes. The end plate 112 further serves to provide some structural support for holding the narrow inner tube 102 in its coaxial position within the larger conductive chamber 104. Additional support may be provided by supporting one or both ends of the tube 102 with Kevlar thread, or equivalent.

As further seen in FIG. 7, an iris 140 may also be used, in some variations of the invention, as described more fully below in connection with FIG. 9. When such iris 140 is used, a resonant cavity 142 is created between the plunger 110 and the iris 140 (i.e., within the left end of the conductive tube 104, as depicted in FIG. 7). The iris 140 is positioned within the conductive tube 104 so as to be "near" the end or tip 118 of the inner tube 102. The iris 140 has an opening therein of substantially the same size as the outer diameter, d2, of the inner tube 102, thereby allowing the tip 118 to protrude through the opening, if desired. For purposes of the present invention, "near" means that the tip 118 is within about the distance d1 from the iris 140, where d1 is approximately equal to the diameter d2 of the tube 102. Thus, the iris is positioned relative to the tube 102 such that the tip 118 is within about one diameter distance d2 from the opening in the iris. In some instances, the tip 118 may protrude through the iris 140 a small distance.

In other instances, the tip 118 may be recessed from the opening in the iris a small distance. In either instance, stored microwave energy resonating within the resonant cavity 142 either evanescently leaks into the tip 118 (if the tip is protruding into the cavity 142) or evanescently leaks through the opening of the iris into the tip 118 (if the tip is recessed from the opening of the iris), in order to support the formation of plasma and to create a whistler wave.

Note that the end 118 (the left end, as shown in FIG. 7) of the narrow inner tube 102 is closed. A second end 120 (the right end, as shown in FIG. 7) of the tube 102 remains open in fluid communication with an end portion 116 of the conductive chamber 104, which end portion 116 lies between the conductive end plate 112 and a further end plate 122 of the conductive chamber 104. Suitable means are provided, such as a gas inlet 124 and a vacuum pump connection 126, for flowing a suitable gas, such as argon or freon, into the end portion 116 of the conductive chamber 104. Because the narrow inner tube 102 is in fluid communication with the end portion 116 by way of the open end 120, such pumping action serves to fill the narrow inner tube with a prescribed gas, e.g., Argon. A suitable seal 115 seals the end plate 112 to the walls of the inner tube 102 so that a vacuum barrier is created between the end portion 116 and a portion 103 of the conductive tube 104 that lies outside of the inner tube 102.

A suitable microwave power source (not shown in FIG. 7) is coupled to the conductive chamber 104 through an appropriate coupling device. For example, as seen in FIG. 8, a tuner made from a 3 dB Hybrid Coupler 128 may be used. Such microwave source thus provides input power, represented by the arrow 125 in FIG. 7, to the chamber 104.

When the iris 140 is not used, the conductive chamber 104, including the plunger 110 and the end plate 112, function as a long resonant cavity 130' (FIG. 8) within the chamber 104 wherein the input power 125 resonates as stored resonant energy. The axial position of the plunger 110 is adjusted, as required, in order to best tune the resonant cavity 130' to the operating frequency of the microwave source.

When the iris 140 is used, that portion of the conductive chamber 104 between the plunger 110 and the iris 140 function as a short resonant cavity 142 (FIG. 7) wherein the input power 125 resonates as stored resonant energy. Again, the axial position of the plunger 110 may be adjusted, as required, in order to best tune the resonant cavity 142 to the operating frequency of the microwave source.

The operation in the absence of the iris 140 will now be explained. Once a resonant condition is established within the long resonant cavity 130' (FIG. 8), a portion of the energy associated with the resonating microwave energy is coupled into the narrow inner tube 102. Initially, the resonating energy is distributed across the entire cross-sectional area of the resonant cavity 130'. Thus, assuming an equal distribution of power across the cross-sectional area (which may or may not be true depending upon the mode of oscillation) the amount of power initially coupled to the narrow tube 102 is a function of the ratio of the cross-sectional area of the narrow tube 102 to the cross-sectional area of the conductive chamber 104. However, as such coupled power begins to ionize the gas within the narrow inner tube 102, thereby starting the formation of a plasma, such plasma represents a load wherein the available resonating power is dissipated. As more plasma is formed, it quickly reaches a point where it represents the dominant power loss for the resonating microwave power. Such dominant power loss serves to draw additional power into the plasma, which additional power advantageously helps to form and sustain the formation of an even higher density plasma. In this manner, resonating microwave energy in the resonant cavity 130' is effectively concentrated to the smaller diameter of the inner tube 102, thereby allowing a higher density plasma to be produced.

In one specific embodiment of the invention, shown in FIG. 8, the conductive tube 104 has an inner diameter of 7.25 inches (18.4 cm), with copper walls that are approximately 0.125 inches thick. (Note, in FIG. 8 the same reference numerals are used to refer to like parts as are used in FIG. 7.) The inner quartz tube 102 has a diameter of 4.44 cm. The length of the resonant cavity 130' is approximately 1.6 m. An insertable magnetic loop probe 132 is provided to measure the power density of the resonating microwave power. Cooling tubes 106, 108 are used, as required, to control the temperature of the chamber 104. A photodiode port 134 provides a rough measure of the plasma density. (Applicant had determined that a photodiode signal is roughly linearly related to the plasma density.) A view port 136 is likewise provided to allow one to view the plasma formation process, as desired. Using the geometry shown in FIG. 8, and using Argon as the prescribed gas at pressures of about 7 mTorr, and by injecting about 3 kW of microwave power into the resonating cavity 130' (frequency =2.45 GHz), and in the presence of a magnetic field of around 0.5 tesla, plasma densities on the order of $4 \times 10^{13}$ cm$^{-3}$ were obtained.

It is noted that the invention requires some means for preventing the formation of plasma within those regions or portions of the conductive tube 104 that are subjected to the resonating microwave energy and/or whistler wave, yet are not inside of the plasma formation tube 102. Such regions or portions are labeled by the reference numeral 103 in FIG. 7. One means for achieving this goal (or preventing plasma formation in the region 103) is to maintain the region 103 at atmospheric pressure. Another means for achieving this goal is to evacuate the region 103. Still another means is to maintain a gas in the region 103 at an intermediate pressure that does not promote the formation of plasma.

Referring next to FIG. 9, another geometry of a specific example of the present invention is shown that uses a narrow inner tube 102 in order to receive the microwave power, thereby effectively concentrating the microwave power. Many of the elements of the geometry shown in FIG. 9 are the same as those shown in FIGS. 7 and 8, and like numerals are used to refer to like parts. Thus, as seen in FIG. 9, the basic geometry is similar to FIGS. 7 and 8, i.e., a narrow inner tube 102 is positioned within a larger conductive chamber 104. An axially adjustable plunger 110 resides at one end of the chamber 104. The other end of the chamber 104 is closed with an end cap plate 122, or equivalent. The narrow inner tube 102 has a closed end 118 and an open end 120. The tube 102 is supported near its open end by the conducting end plate 112, and at its closed end by a conducting iris 140. The open end 120 of the narrow tube 102 is in fluid communication with the an end region 116 of the conductive tube 104. A suitable gas, such as Argon, may be pumped into the region 116 after the region 116, and hence the tube 102, has been evacuated using a suitable vacuum pump connected to the pump port 126.

Microwave power from a suitable microwave power source is coupled into the other end of the conductive chamber 104 between the plunger 110 and the conductive iris 140. The region between the plunger 110 and the conductive iris 140 functions as a short resonant cavity 142 wherein input power from the microwave source is made to resonate. The end or tip 118 of the narrow inner tube 102 is positioned so as to be "near" (as that term is defined above) an opening in the conductive iris 140. A magnetic loop probe 132, view port 136, and photodiode port 134 are provided as measurement aids for use with the conductive chamber 104, as described above. Further, a double plasma probe (Langmuir probe) 144 may be selectively inserted into the narrow inner tube 102, from its open end 120, as needed, in order to make direct measurements of the plasma density. (Such probe may also be used with the geometry shown in FIGS. 7 or 8).

As seen by comparing the geometries of FIGS. 8 and 9, the principal difference between the two geometries is the addition of the conducting iris 140 near the closed end of the narrow inner tube 102. Thus, the plasma that is formed within the narrow inner tube 102 resides outside of the resonant cavity 142. The iris 140 serves to not only define one end of the resonant cavity, but also suppresses unwanted modes (e.g., the deleterious TEM mode) associated with the resonating microwave power.

Still referring to FIG. 9, the manner in which plasma is formed in the narrow inner tube 102 will be described. Resonant microwave energy is stored within the resonant cavity 142. A prescribed gas is placed in the narrow inner tube 102. Initially, prior to the formation of any plasma, some of the stored energy associated with the resonating microwave energy leaks evanescently through the iris into the region of the tube 102 near its closed end 118. Such power begins to ionize and break down the gas, thereby forming a plasma. As the plasma is formed, more microwave power is drawn into the closed end of the tube 102, and is carried into the tube 102 by the whistler wave. The whistler wave subsequently sustains the plasma formation.

An additional element present in the geometry of FIG. 9 that was not included in the geometry of FIG. 8 is a means for cooling the tip 118 of the inner quartz tube 102. The means shown in FIG. 9 comprise an air inlet 145 through which a stream of air can be directed over the closed tip (dome) of the inner tube 102. Other cooling means could, of course, also be employed.

Using the geometry shown in FIG. 9, plasma densities on the order of $2.7 \times 10^{13}$ cm$^{-3}$ were achieved using an input power level of around 3 kW (frequency =2.45 GHz), a magnetic field strength of 0.4 tesla, and an Argon pressure of about 7 mTorr. The diameter of the conductive chamber was again 7.25 inches (18.4 cm), and the length of the plasma column was around 200 cm. The length of the resonant cavity 142 was 31.4 cm.

Thus, it is seen that the geometries of FIGS. 8 and 9, each of which represent a variation of the more general geometry shown in FIG. 7, provide an effective means for concentrating microwave power into a smaller plasma column, thereby increasing the power density, and increasing the plasma density. It is to be emphasized that the geometries of FIGS. 7-9 are not equivalent to simply using a smaller diameter copper plasma filled chamber. As is known to those of skill in the art, for a given microwave frequency, one cannot decrease the diameter of a resonant cavity below a certain cut-off diameter. However, by using the coaxial approach described herein, it is possible to concentrate the power associated with the resonant cavity to a plasma column (or plasma formation tube) with a diameter smaller than the cut-off diameter of the associated resonant cavity. This is a significant advantage, as it allows the power density, and hence the achievable plasma density, to be increased.

Figure 10:
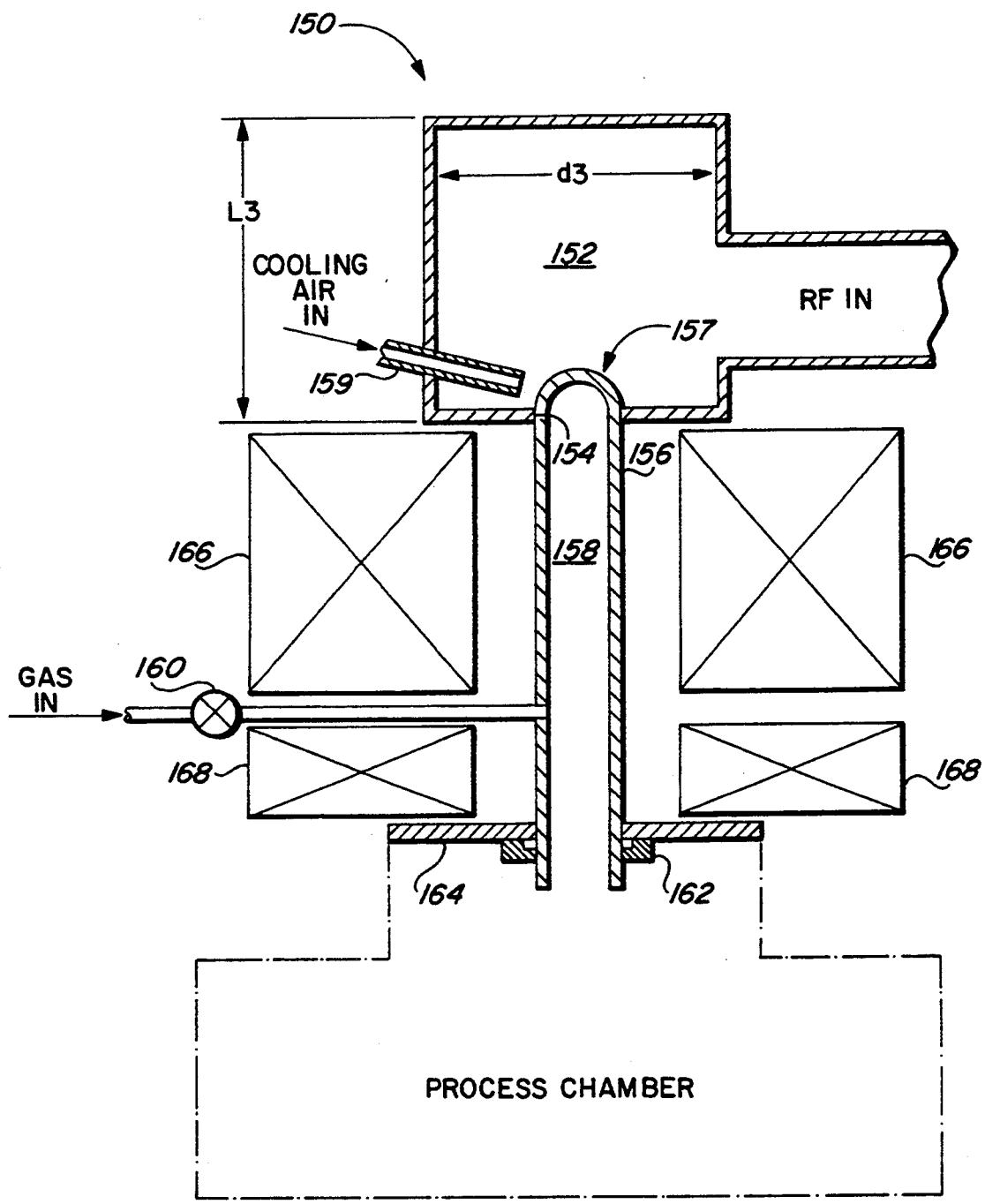
FIG. 10 diagrammatically shows a plasma applicator made in accordance with the embodiment of the invention depicted in FIGS. 7 and 9.

Further variations of the geometry shown in FIG. 7, directed to specific applications of the invention, are shown in FIGS. 10 and 11. In FIG. 10, a plasma applicator 150 is depicted. The plasma applicator 150 provides a relatively small diameter modular plasma source that may be used for performing ion implantation, ion beam milling, ion-assisted deposition, or plasma etching. A suitable continuous wave (CW) radio frequency (rf) source provides high power rf energy into a top chamber 152 of the applicator 150. The rf source typically includes a magnetron, circulator and tuner (not shown). Typical input power levels range from 1 KW to about 30 KW. The excitation frequency may be, e.g., 2.45 GHz. The top chamber 152 is made from a conducting material, such as copper or aluminum. It (the chamber 152) is a cylindrical cavity having a diameter d3 large enough to propagate the $TE_{01}$ waveguide mode. The chamber 152 functions as a resonant cavity for the $TE_{01}$ mode, having a length L3 that is equal to an integral number of half wavelengths of the resonating microwave energy. Plasma discharges are prevented from occurring in the resonant cavity 152 by allowing it to be at atmospheric pressure, by evacuating it, or by some other appropriate means.

The cavity or chamber 152 has an opening 154 therein. A fused quartz tube 156 defines a plasma chamber 158. A tip 157 of the tube 156 is positioned near the opening 154. A cooling tube 159 allows a coolant, such as air, to be directed to the tip 157 of the tube 156. The rf energy stored in the resonant cavity 152 leaks evanescently into the plasma chamber 158, thereby initiating the plasma. The plasma chamber 158 is maintained at a low pressure, e.g., within the range of 0.1-10 mTorr, depending upon the desired process. A suitable gas, such as Argon or Freon, is introduced into the chamber 158 with a metering valve 160 or mass flow controller. A sliding vacuum seal 162 seals the sides of the open end of the plasma chamber 158 to a standard vacuum flange 164. The size of the vacuum flange 164 is chosen to be compatible with commercially available process chambers. The tip 157 of the plasma chamber, which is preferably a hemispherical end cap, is cooled using an appropriate cooling process, e.g., by injecting an stream of coolant thereacross.

The plasma chamber 158 is immersed in a magnetic field of about 0.5 Tesla. Such magnetic field is produced by a pair of conventional coils 166 and 168. The coil 166 is split from the coil 168 so that the electrical current in each coil can be independently controlled. As the plasma follows the field lines, it is also possible to steer the plasma as its exits the open end of the plasma chamber 158 by appropriately controlling the magnetic field in the coil 168.

Referring next to FIG. 11, plasma etching apparatus 170 made in accordance with the present invention is diagrammatically depicted. An appropriate power source (not shown), such as a magnetron, circulator, and tuner, introduces rf power into a top chamber 172.

Typical input power levels range from 3KW to about 100 KW. The excitation frequency is, e.g., 915 MHz. The chamber or cavity 172 is made from a conducting material, such as copper or aluminum. It is a cylindrical cavity having a diameter d4 large enough to propagate the $TE_{01}$ mode. The cavity or chamber 172 functions as a resonant cavity for rf energy in this mode. The length L4 of the cavity is equal to an integral number of half-wavelengths of the resonating rf energy. The cavity 172 is maintained at atmospheric pressure to prevent plasma discharges from occurring therein. Other techniques for preventing plasma discharge may also be used, such as by evacuating the cavity 172.

As with the apparatus shown in FIG. 10, the cavity or chamber 172 has an opening 174 therein. A fused quartz tube 176 defines a plasma chamber 178. A closed end 177 of the tube 176 is positioned near the opening 174. The end 177 may be cooled through cooling tube 179 with a suitable coolant. The rf energy stored in the resonant cavity 172 leaks evanescently into the plasma chamber 178, thereby initiating the plasma. The plasma chamber 178 is maintained at a low pressure, e.g., within the range of 0.1-10 mTorr, depending upon the desired process. A suitable gas, such as Argon or Freon, is introduced into the chamber 178 with a metering valve 180 or mass flow controller. A sliding vacuum seal 182 seals the sides of the open end of the plasma tube 176 to the rest of the chamber, which may be made from aluminum. A working piece 190 sits on a substrate table 192. A mechanical stop 183 prevents the tube 176 from sliding onto the substrate table 192. As needed, the working piece may be cooled with a heat exchanger and may be biased with a dc potential and an rf potential in order to draw ions towards the substrate. The closed end 157 of the plasma chamber, which is preferably a hemispherical end cap, is cooled using an appropriate cooling process, e.g., by injecting a stream of coolant thereacross. At low power levels, cooling may be by forced air convection. At high power levels, a liquid coolant may be used.

The plasma chamber 178 is immersed in a magnetic field of about 0.19 Tesla. Such magnetic field is produced by a pair of conventional coils 186 and 188. The coil 186 is split from the coil 188 to allow a mechanical device (not shown) to position the working piece 90 on the substrate table 192. Further, by splitting the coils 186 and 188, the electrical currents in each coil can be independently controlled, thereby allowing the magnetic field to be used to optimize the desired process.

As described above, it is thus seen that the present invention provides apparatus and methods for making dense plasma that may be used for a wide variety of applications, from plasma processing, e.g., plasma etching, to lasers, ion sources, and sputtering guns.

As further described above, it is seen that the present invention provides specific geometries or configurations wherein high frequency microwave or other rf energy may be launched into a gas confined within a suitable "long" cavity. The high frequency of the rf energy allows for an increased density limit imposed by collisional damping, thereby allowing a high density plasma to be formed within the cavity. Advantageously, the launched energy in the long cavity is in the form of a whistler wave, which whistler wave, in combination with a suitable axial magnetic field, allows the high density plasma to be created.

As also described above, it is seen that the invention provides a plasma production device and/or method wherein the desired whistler wave is excited in the plasma by either axially or radially coupling microwave or other rf energy into the plasma chamber, as best suits the needs for the particular application at hand with which the plasma is used. The desired whistler wave is excited through the use of a high Q resonant cavity.

Further, it is seen from the above description that the invention provides a means for exciting plasma without using electrodes.

While the invention herein disclosed has been described by means of specific embodiments and applications thereof, numerous modifications and variations could be made thereto by those skilled in the art without departing from the scope of the invention set forth in the claims.

What is claimed is:

1. Plasma production apparatus comprising:
    a conductive cylindrical chamber having a first cross-sectional area and a first longitudinal axis;
    power input means for injecting microwave power into said cylindrical chamber;
    resonating means for causing said microwave power to resonate within said cylindrical chamber, said resonating means comprising a resonant cavity positioned within the cylindrical chamber, said resonant cavity having a conductive end plate at one end thereof and a conductive plunger at the other end thereof;
    a non-conducting plasma formation tube filled with a prescribed gas having a second cross sectional area less than said first cross-sectional area, said plasma formation tube having a second longitudinal axis and being positioned within said cylindrical chamber so that said second longitudinal axis is substantially coincident with said first longitudinal axis;
    concentrating means for concentrating the resonating microwave power, which initially fills the first cross-sectional area, down to the second cross-sectional area of said plasma formation tube, thereby providing an increased power density in said second cross-sectional area;
    means for drawing said microwave power at said increased power density into said plasma formation tube as a whistler wave, said whistler wave ionizing said prescribed gas, thereby forming a plasma within said plasma formation tube; and
    means for preventing the formation of plasma in the cylindrical chamber outside of said plasma formation tube.

2. The plasma production apparatus as set forth in claim 1 wherein said means for propagating the microwave power through the plasma formation tube includes magnetic field generating means for generating a magnetic field with an associated electron cyclotron frequency $\omega_{ce}$, and magnetic field lines that are substantially parallel to said first and second longitudinal axes, and further wherein said microwave power has a frequency $\omega$ associated therewith, where $\omega_{ce}$ is greater than $\omega$.

3. The plasma production apparatus as set forth in claim 2 wherein said plasma formation tube passes through a center of said conductive end plate, with a major portion of said plasma formation tube protruding into said resonant cavity.

4. The plasma production apparatus as set forth in claim 3 wherein said concentrating means includes means for initiating the formation of a plasma within said plasma formation tube; said plasma, once initiated, comprising a dominant power loss for the resonating microwave power within said resonant cavity; which power loss draws additional microwave power into said plasma formation tube, which additional microwave power effectively concentrates additional power within the second cross-sectional area of said plasma formation tube, thereby providing an increased power density in the plasma formation tube, which increased power density sustains the formation of a plasma within said plasma formation tube having an increased density.

5. The plasma production apparatus as set forth in claim 4 wherein said plasma formation tube is in fluid communication with the first end of said cylindrical chamber on a side of said conductive end plate that is not within said resonant cavity, and wherein said cylindrical chamber includes an inlet port through which said prescribed gas may flow and a pump port to which a pump may be attached, said inlet and pump ports allowing said prescribed gas to enter said plasma formation tube and be maintained at a prescribed pressure.

6. The plasma production apparatus as set forth in claim 2 further including a conductive iris plate spaced inwardly within the cylindrical chamber and apart from said conductive plunger; said conductive iris being positioned within about a distance $\pm d1$ from a tip of said plasma formation tube, said distance $d1$ being approximately equal to a diameter $d2$ of said plasma formation tube; said conductive iris having an opening therein through which the resonating microwave power may evanescently penetrate into said plasma formation tube to initiate the plasma; a remainder of the plasma formation tube being located outside of said resonant cavity but still within said cylindrical chamber.

7. The plasma production apparatus as set forth in claim 6 wherein the opening of said conductive iris has a diameter of at least approximately $d2$, whereby the tip of said plasma formation tube may fit inside of said opening as it is positioned within the distance $\pm d1$ of said conductive iris.

8. The plasma production apparatus as set forth in claim 7 wherein said plasma formation tube comprises a fused quartz tube coaxially mounted within said cylindrical chamber, an end of said tube opposite the tip positioned within a distance $\pm d1$ of said conductive iris being in fluid communication with a source of said prescribed gas and a pump means for maintaining a prescribed pressure of said gas, whereby said fused quartz tube may be filled with said prescribed gas at said prescribed pressure.

9. The plasma production apparatus as set forth in claim 1 further including cooling means for cooling said plasma formation tube.

10. The plasma production apparatus as set forth in claim 1 wherein said means for preventing the formation of plasma in the cylindrical chamber outside of said plasma formation tube comprises means for maintaining the area of said cylindrical chamber that lies outside of said plasma formation tube at atmospheric pressure.

11. The plasma production apparatus as set forth in claim 1 wherein said means for preventing the formation of plasma in the cylindrical chamber outside of said plasma formation tube comprises means for evacuating the area of said cylindrical chamber that lies outside of said plasma formation tube.

12. Plasma production apparatus comprising:
    a conductive substantially cylindrical chamber having a first length and diameter and a first longitudinal axis;

means for injecting microwave power into a first end of said cylindrical chamber;

a conductive end plate disposed near a second end of said cylindrical chamber, said conductive end plate and cylindrical chamber comprising a resonant cavity wherein said microwave power resonates;

a quartz tube having a second length and diameter less than the first length and diameter, respectively, of said cylindrical chamber; said quartz tube being positioned inside of said cylindrical chamber so that a second longitudinal axis of said quartz tube is substantially coaxial with the first longitudinal axis of said cylindrical chamber; a first end of said quartz tube being disposed near the first end of said cylindrical chamber;

means for filling said quartz tube with a prescribed gas at a prescribed pressure;

said resonating microwave power being both inside and outside said quartz tube;

the microwave power inside of said quartz tube ionizing said prescribed gas to initiate the formation of a plasma within said quartz tube; and wherein said plasma, once initiated, represents a dominant power loss for the resonating microwave power, thereby drawing additional microwave power into said quartz tube, which additional microwave power further serves to feed and sustain the formation of the plasma within said quartz tube;

whereby plasma is produced within said quartz tube.

13. The plasma production apparatus as set forth in claim 12 further including means for exciting a mode of said microwave power that causes a whistler wave to propagate longitudinally through said cylindrical chamber, including said quartz tube.

14. The plasma production apparatus as set forth in claim 13 wherein said first end of said cylindrical chamber includes an adjustable plunger that may be used to tune said resonant cavity.

15. Plasma production apparatus comprising:

a conductive substantially cylindrical chamber having a first length, a first diameter, and a first longitudinal axis;

means for injecting microwave power into a first end of said cylindrical chamber;

a conductive iris end plate positioned within said cylindrical chamber and spaced apart from said first end, a region of said cylindrical chamber bounded by said first end and said conductive iris end plate comprising a resonant cavity wherein said microwave power resonates, said conductive iris end plate having an aperture of a second diameter therein;

a quartz tube having a second length less than the first length, a closed end and an open end, and a diameter that is approximately the same as said second diameter, said quartz tube being positioned inside of said cylindrical chamber so that the closed end of said quartz tube is within a distance of about ±d1 of said conductive iris end plate;

means for filling said quartz tube with a prescribed gas at a prescribed pressure;

said resonating microwave power evanescently penetrating the closed end of the quartz tube, said microwave power thus penetrating said quartz tube ionizing said prescribed gas to initiate the formation of a plasma within said quartz tube; and wherein said plasma, once initiated, represents a dominant power loss for the resonating microwave power, thereby drawing additional microwave power into said quartz tube, which additional microwave power further serves to sustain the formation of the plasma within said quartz tube;

whereby plasma is produced within said quartz tube.

16. The plasma production apparatus as set forth in claim 15 wherein said first end of said cylindrical chamber includes an adjustable plunger that may be used to tune said resonant cavity.

17. Apparatus for producing high density plasma comprising:

a plasma formation tube having a first cross-sectional area;

means for filling said plasma formation tube with a prescribed gas at a prescribed pressure;

a resonant cavity having a second cross-sectional area, said second cross-sectional area being greater than said first cross-sectional area;

means for injecting microwave energy into said resonant cavity and causing said microwave energy to resonate, said resonating microwave energy having a power density associated therewith that is a function of said second cross-sectional area;

means for concentrating the resonating microwave energy from said second cross-sectional area to said first cross-sectional area, thereby increasing the power density associated with the microwave energy; and means for launching the concentrated microwave energy into the plasma formation tube as a whistler wave;

said whistler wave causing said prescribed gas to ionize, thereby forming a plasma.

18. The plasma production apparatus of claim 18 wherein said plasma formation tube is coaxially positioned inside of said resonant cavity.

19. The plasma production apparatus of claim 18 wherein said plasma formation tube has a closed end, and further wherein said plasma formation tube is axially aligned with said resonant cavity, with the closed end of said plasma formation tube being positioned a distance ±d1 from one end of said resonant cavity, where d1 is approximately equal to a diameter d2 associated with said second cross-sectional area.

20. A method for producing high density plasma comprising:

(a) filling a non-conductive plasma formation tube with a prescribed gas at a prescribed pressure, said plasma formation tube having a first cross-sectional area;

(b) injecting microwave power into a resonant cavity having a second cross-sectional area, said second cross-sectional area being greater than said first cross-sectional area, said microwave power having a power density associated therewith;

(c) drawing the resonating microwave power from said second cross-sectional area down to said first cross-sectional area, thereby increasing the power density of the microwave power; and (d) launching the concentrated microwave power into the plasma formation tube as a whistler wave; said whistler wave causing said prescribed gas to ionize, thereby forming a plasma.

* * * * *